United States Patent [19]
Lowe

[11] Patent Number: 5,835,158
[45] Date of Patent: Nov. 10, 1998

[54] ANALOG SIGNAL PROCESS WITH DITHER PATTERN

[75] Inventor: Virgil Lowe, Roswell, Ga.

[73] Assignee: J. Carl Cooper, Monte Sereno, Calif.

[21] Appl. No.: 924,708

[22] Filed: Aug. 4, 1992

[51] Int. Cl.⁶ .................................................. H04N 7/24
[52] U.S. Cl. .......................................... 348/574; 341/131
[58] Field of Search ...................... 348/574, 572, 348/471, 472; 358/133, 138, 141, 13, 12, 457; 341/131, 126; 327/63, 72, 145; 382/251, 252, 271; 381/124; H04N 5/14, 7/24, 7/13

[56] References Cited

U.S. PATENT DOCUMENTS

| | | |
|---|---|---|
| 3,244,808 | 4/1966 | Roberts . |
| 3,656,152 | 4/1972 | Gundersen . |
| 3,877,022 | 4/1975 | Lehmon et al. . |
| 3,984,624 | 10/1976 | Waggener ................................ 348/473 |
| 4,183,016 | 1/1980 | Sawagata . |
| 4,447,803 | 5/1984 | Crosby ................................... 348/574 |
| 4,543,599 | 9/1985 | Willis et al. ............................ 348/574 |
| 4,651,293 | 3/1987 | Kato ....................................... 358/457 |
| 4,827,343 | 5/1989 | Naimpally ............................... 348/574 |

FOREIGN PATENT DOCUMENTS 0543220  5/1993  European Pat. Off. ................ 348/574

0167674  6/1992  Japan .............................. H04N 5/14

OTHER PUBLICATIONS

Roberts, Lawrence Gilmon "Picture Coding Using Pseudo–Random Noise" IRE Transactions On Information Theory pp. 145–154 Feb. 1962.

Thompson et al., "A Pseudo–Random Quantizer for Television Signals" Proceedings of the IEEE vol. 55 No. 3 Mar. 1967.

Primary Examiner—David E. Harvey
Attorney, Agent, or Firm—J. Carl Cooper

[57] ABSTRACT

The present invention provides distortion compensating of an analog signal. A dither device processes a clock signal from a clock signal generator to provide an output signal with a dither pattern. The output signal with the dither pattern has a plurality of different frequencies that are periodically repeated. In addition, the same frequency of respective cycles of the dither pattern has different phases. The dither signal is further superimposed on the analog signal. Thus, distortion of the composite analog signal is compensated. In particular, this dither analog signal may be converted into a digital signal in response to the clock signal so that the digital signal approximates to the analog signal much more than the digital signal obtained by conventional analog to digital converting.

19 Claims, 5 Drawing Sheets

ANALOG SIGNAL PROCESS WITH DITHER PATTERN

BACKGROUND OF THE INVENTION

The present invention relates to signal processing and, in particular, to analog signal processing. A major objective of the present invention is to compensate distortion of an analog signal using a dither pattern. Thus, during converting the compensated analog signal into a digital signal, a quantizing error is significantly reduced.

Much of modern technology is closely identified with signal processing. Signal processing technology commonly associates with converting an analog signal into a digital signal. Usually, analog to digital (A/D) conversion includes sampling of an analog signal, holding the sampled value, quantizing the sampled value and encoding the quantized value into a digital representation.

A digital quantity is discrete, allowing changes at a certain sample distance, whereas the analog signal changes continuously. Therefore, what is expected during the quantizing is to approximate to the analog signal as accurately as possible with minimum quantizing error. While converting the analog signal into the digital signal, quantizing error is inevitably introduced. Generally, quantizing error may be reduced at the expense of higher sampling accuracy; however, this increases the cost of the A/D convertor.

In particular, an analog video signal is preferred to be converted into a digital video signal, for example in a digital video system. A typical example of the video system is a television (TV) system. Conventional TV systems usually employ a sequential scanning or an interlaced scanning to reproduce a picture imaged by a camera. In a TV system using sequential scanning, a complete picture is reproduced by a single raster. On the other hand, a TV system using interlaced scanning then reproduces a complete picture by two succeeding rasters, in which the respective scanning lines of the two rasters are alternative in succession.

Signal distortion which exists in analog TV video signals often causes blurred vision effect. When distortion of the analog TV video signal occurs during scanning, there may be flicker on reproduced pictures. In an extreme case, the distortion happens at an identical phase angle at respective scanning lines, a trap pattern will be visualized on the pictures of the TV screen. Moreover, distortion of an analog video signal strengthens quantizing error during A/D conversion, thereby impairing quantization accuracy of A/D conversion.

The quantizing distortion of a digital TV video signal can be addressed using different approaches. For example, an error feedback circuitry is disclosed by C. P. Sandbank in "Digital Television", pages 552-557, 1990. However, this error feedback circuitry is used to improve aliasing and quantizing distortions, which are more troublesome in chroma-keying than most other digital video processing operations.

Most suggested approaches address quantizing error by improving A/D conversion. However, those suggestions require a great deal of attention on improving the quantizing error itself during the quantizing of A/D conversion. What is needed is an analog signal compensation before the A/D conversion, which offsets the distortion of the analog signal by using a dither pattern. Furthermore, the compensated analog signal can be converted into a digital signal with moderated levels of quantizing error as compared to an uncompensated analog signal.

SUMMARY OF THE INVENTION

In accordance with the present invention, an analog signal processing device comprises means for providing an analog signal, and dither means for converting a frequency of a periodic signal at a variable frequency-dividing ratio, thereby producing a dither signal. The dither signal has a plurality of cycles with each having a predetermined phase shift. The cycles have different frequency components. Thus, this dither signal with repeated frequency change as well as different phases in respective cycles compensates the distortion of the analog signal.

Combining means is used to combine the dither signal with the analog signal, thereby generating a composite analog signal. The analog signal processing device of the present invention also comprises a signal generator for providing the periodic signal to be processed by the dither means. An A/D convertor is provided for converting the composite analog signal into a digital signal in response to the periodic signal. Thus, a quantizing error during the A/D conversion is greatly modified. Preferably, the A/D convertor has an output ranged of 8 to 16 bits.

The periodic signal may be generated by a signal generator in the dither means; alternatively, the periodic signal may also be supplied by other devices. In particular, the frequency-dividing ratio conforms to P/N, where P and N are positive integers and $1 \leq P \leq (N-1)$. Preferably, the ratio conforms to $1/2^N$, where N is a positive integer. Also, the analog signal processing device of the present invention may be applied to process a periodic analog signal, an audio analog signal or a video analog signal.

A preferred embodiment in accordance with the present invention is for processing an analog video signal. A signal generator provides a sampling clock signal in response to a synchronizing signal of the analog video signal. Dither means converts the frequency of the sampling clock signal at a variable frequency-dividing ratio in response to the synchronizing signal, to produce a compensating signal. The compensating signal has a plurality of components which have different frequencies and phases.

Combining means further combines the compensating signal with the analog video signal to generate a dithered video signal. Furthermore, an A/D convertor is coupled to the combining means so that the dithered video signal from the combining means is converted into a digital signal in response to the sampling clock signal. Preferably, the output of the A/D convertor covers a range of 8 to 12 bits. The predetermined frequency-divided ratio is constrained as P/N, where P and N are positive integers and $1 \leq P \leq (N-1)$. Preferably, the ratio is determined by $1/2^N$.

A dither method of the present invention comprises periodically converting a predetermined frequency of a clock signal at a predetermined dividing ratio to produce a dither signal. The dither signal has a variable frequency that has a predetermined phase shift in respective cycles of the dither signal. The dither signal is further combined with the analog signal so as to produce a dithered analog signal. The dithered analog signal may be converted into a digital signal by an A/D convertor with substantially reduced quantizing error.

In particular, when the dither compensation in accordance with the present invention is available to process an audio signal, it offsets the distortion of the audio signal. Accordingly, an improved audio effect may be realized. Additionally, regulating the frequency-dividing ratio and the cycles of the dither pattern may achieve requested sound qualities.

An analog video signal, for example a TV video signal, is suitably processed by the present invention. While most TV systems employ interlaced scanning, distortion of the TV video signal will be compensated using the dither pattern, in which the consecutive scanning lines of each frame have the same variable frequency; and the variable frequencies of respective lines have different phases. Therefore, the process in accordance with the present invention may result in a more pleasing visible sensation.

Another advantage is that the analog signal processed by the present invention is favorable for modifying the quantizing error induced during the A/D conversion. Unlike most suggested approaches, the process in accordance with the present invention offsets the distortion of the analog signal prior to A/D conversion. As a result, the digital signal more precisely approximates to the analog signal. These and other features and advantages of the present invention are apparent from the description below with reference to the following drawings.

DESCRIPTION OF THE PREFERRED EMBODIMENTS

Figure 1:
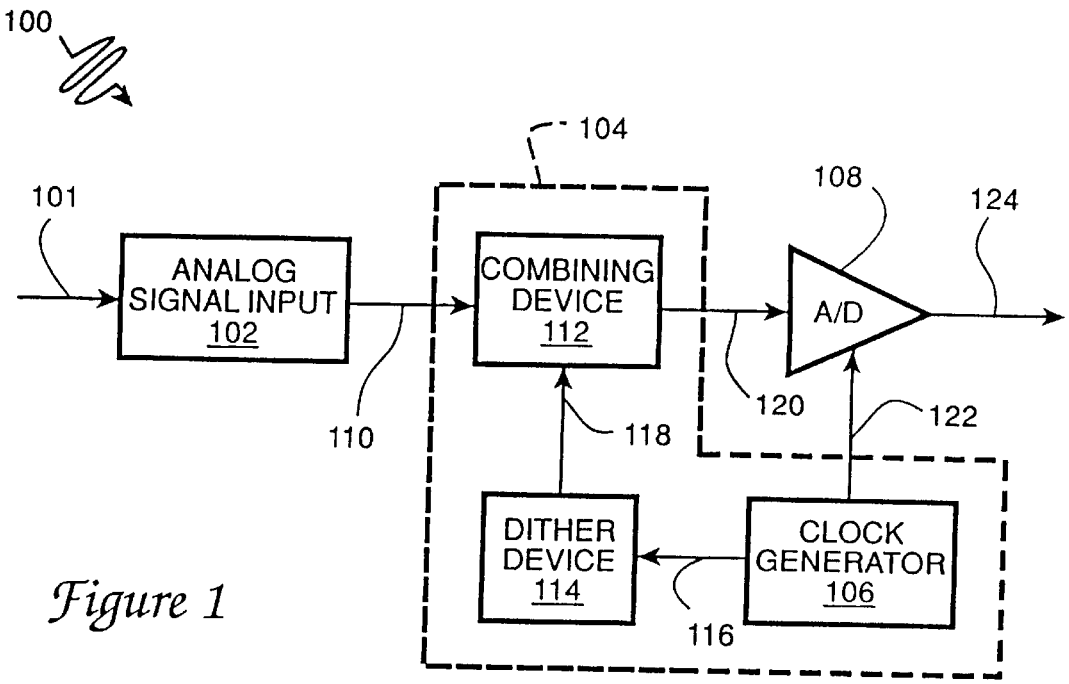
FIG. 1 is a diagram of an analog signal processing device in accordance with the present invention.

An analog signal processing system 100 in accordance with the present invention includes an analog input 102, a processing device 104, and an A/D converter 108, as shown in FIG. 1.

An analog signal 101 is applied to processing device 104 via analog signal input 102 and 110. The processing device 104 includes a clock generator 106, a combining device 112, and a dither device 114. Clock generator 106 produces a clock signal with a predetermined frequency, which is applied to dither device 114. While clock generator 106 is incorporated in the dither device 114 to provide the clock signal, a clock signal provided by another device may also be processed by the analog signal processing system 100. Dither device 114 functions as a frequency divider for converting the frequency of the clock signal by a variable frequency-dividing ratio.

The frequency of the clock signal is divided by a variable frequency-dividing ratio in dither device 114 to obtain an output signal with a variable frequency; the variable frequency-dividing ratio is selected to conform to P/N, where P and N are positive integers and $1 \leq P \leq (N-1)$, and the process of frequency-dividing is periodically repeated. Thus, the frequency of the signal output from dither device 114 is variable as the variable frequency-dividing ratio.

Dither device 114 may generate the requested variable-frequency signal by way of that dither device 114 first provides a plurality of signals with different frequencies. The signals then are selectively output under control of a controller in dither device 114. Thus, the output signal of the dither device 114 is also appears as a signal having the variable frequency.

Therefore, dither device 114 outputs a variable frequency signal within a predetermined period. In addition, dither device 114 shifts phase of each cycle of the variable frequency signal on the basis of a predetermined phase. Thus, the variable-frequency signal from dither device 114 has a plurality of different frequencies in each cycle, and the variable frequency signal also has different phases in respective cycles.

The variable frequency signal may be regulated by changing the value of P or N depending on different requests and signal types. This regulation is very helpful to achieve requested compensation for distortion of the analog signal. Similarly, the period of the variable frequency signal may also be controlled to reach a predetermined compensation effect.

The variable frequency signal from dither device 114 is fed to combining device 112 via 118. Combining device 112 may be implemented by an adder, a multiplier, a mixer and/or operator circuits. The combining device 112 serves to combine the dither signal with the analog signal from analog signal input 102. Accordingly, distortion of the analog signal is at least partially offset prior to A/D conversion. The dithered analog signal output from combining device 112 is transferred to A/D converter 108 via 120. The clock signal from clock generator 106 functions as a sampling signal being fed to A/D convertor 108 via 122. A/D convertor thus converts the dithered analog signal into a digital signal in response to the clock signal.

Figure 2:
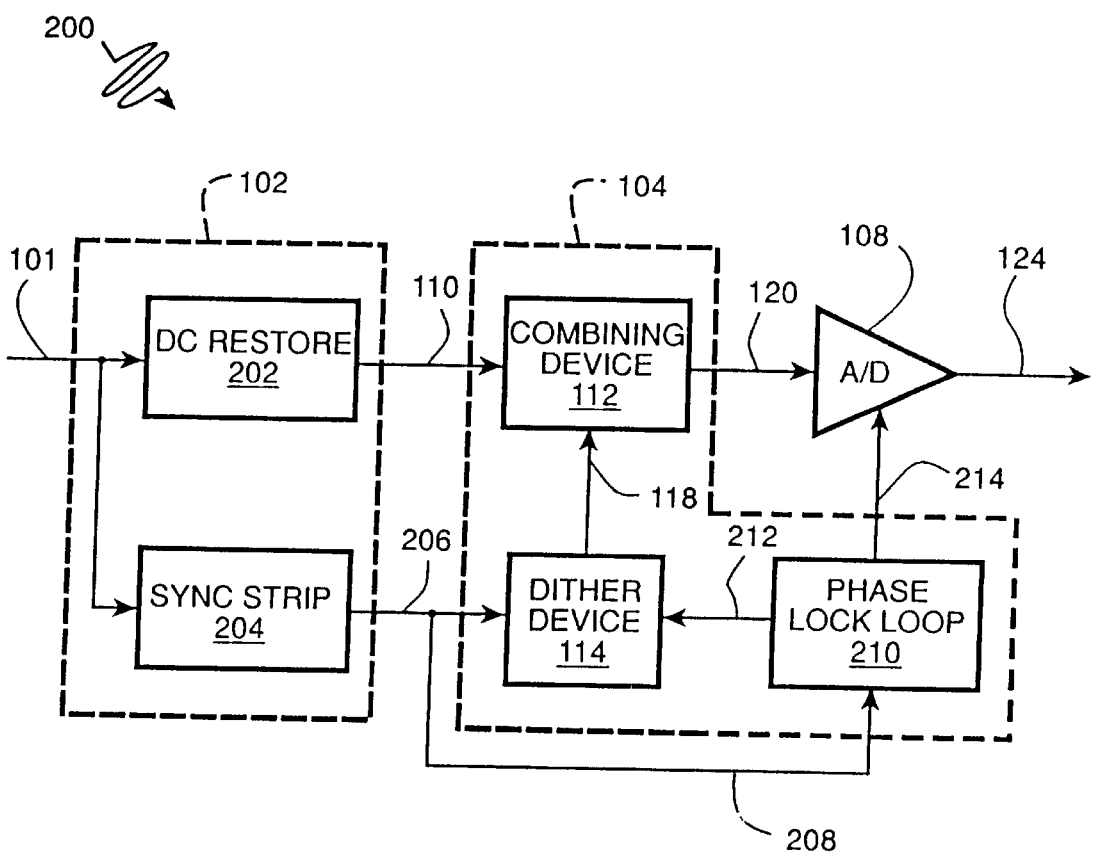
FIG. 2 shows a preferred embodiment of the present invention for processing an analog video signal.

As a preferred embodiment of the present invention, the system in accordance with the present invention is available to process an analog video signal, for example a TV video signal. Signal input 102 includes a DC (direct current) restore 202 and a sync (synchronizing) strip 204, as shown in FIG. 2. DC restore 202 buffers the TV video signal and further ushers the buffered video signal to combining device 112 via 110. The sync strip 204 is then used to separate horizontal synchronizing signals or color burst from the analog video signal.

The horizontal synchronizing signal from sync strip 204 is applied to dither device 114 via 206 and a PLL (phase lock loop) 210 via 208, respectively. PLL 210 enhances the synchronizing signal to resist interference. PLL 210 also functions to synchronize the color burst with input video signal. The output of PLL 210 is a clock signal. For example, the frequency of the clock signal used in a TV video signal is 10.7 MHz, 13.5 MHz or 14.3 MHz. The clock signal from PLL 210 is applied to dither device 114 via 212. Dither device 114 converts the frequency of the clock signal at the frequency-dividing ratio of P/N.

Specifically, the horizontal synchronizing signal controls dither device 114 so that corresponding to each cycle of the horizontal synchronizing signal, dither device 114 generates an output signal with a frequency determined by the dividing ratio P/N. The value of P/N may be varied as required.

Figure 3:
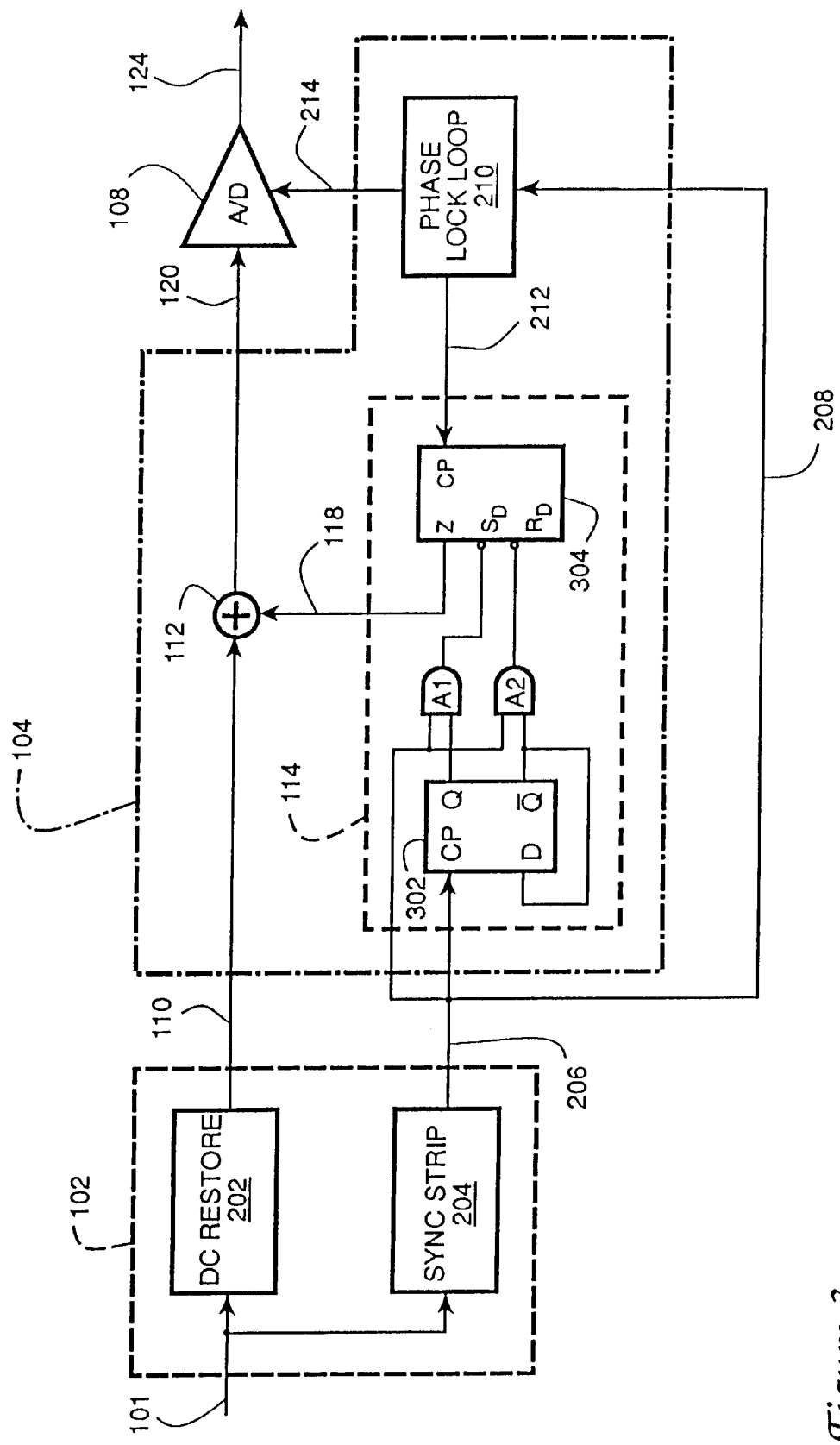
FIG. 3 illustrates a detailed circuit diagram of FIG. 2.

A detailed circuitry of FIG. 2 is shown in FIG. 3. Where dither device 114 is implemented by a flip-flop 302, AND gates A1 and A2, and a counter 304. Flip-flop 302 is connected so that upon arrival of the horizontal synchronizing signal from sync strip 204, the present output at Q output of flip-flop 302 is switched into a level that is the same as previous level holding at its $\overline{Q}$ output. For example, when $\overline{Q}$ output of flip-flop 302 is at a low level, a trigger edge of the horizontal synchronizing signal sets the Q output of flip-flop 302 at a low level, and turns the $\overline{Q}$ output at a high level. Furthermore, upon the arrival of the next trigger edge of the horizontal synchronizing signal, flip-flop 302 will provide a high level at the Q output, but a low level at the $\overline{Q}$ output.

The horizontal synchronizing signal from sync strip 204 is also applied to the inputs of both AND gates A1 and A2. The Q output of flip-flop 302 is coupled to another input of AND gate A1 so that the Q output is anded with the horizontal synchronizing signal at AND gate A1, generating an anded output. On the other hand, the $\overline{Q}$ output of flip-flop 302 is anded with the horizontal synchronizing signal at the inputs of AND gate A2. The output signals by AND gate A1 and A2 are fed to counter 304 to set its frequency-dividing ratio.

Counter 304 functions as a multiple frequency divider with different frequency-dividing ratios. The clock signal from PLL 210 is applied to counter 304 where the frequency-dividing process is performed. Once the output signal from AND gate A2 arrives at $R_D$ input, counter 304 begins frequency-dividing process of the clock signal at a first frequency-dividing ratio. This processing lasts until the output of AND gate A1 triggers SD input of counter 304. Counter 304 then begins frequency-dividing process at a second frequency-dividing ratio, which will continue until the output of AND gate A2 sets counter 304 again. The alternative outputs of AND gates A1 and A2 trigger counter 304 to produce a signal having the variable frequency. The variable frequency is determined by the frequency-dividing ratio.

Timing of the frequency-dividing process depends on the signal to be processed and requirements. Accordingly, under the control of the alternative outputs at AND gates A1 and A2, an output signal with different frequencies may be obtained. The frequency-dividing process may be repeated periodically as well as continuously. For example, in response to the setting signal from AND gates A1 and A2, the frequency of the clock signal is consecutively divided by a variable ratio in an order of 1/4, 1/2 and 3/4. The variable ratio further is periodically repeated.

Therefore, the output signal of counter 304 has a frequency that is periodically varied. This variable frequency signal is superimposed on the buffered video signal at combining device 112 implemented by a signal adder. A/D converter 108 converts the composite analog video signal from combining device 112 into a digital signal in response to the clock signal being used for a sampling signal of A/D converter 108.

Figure 4:
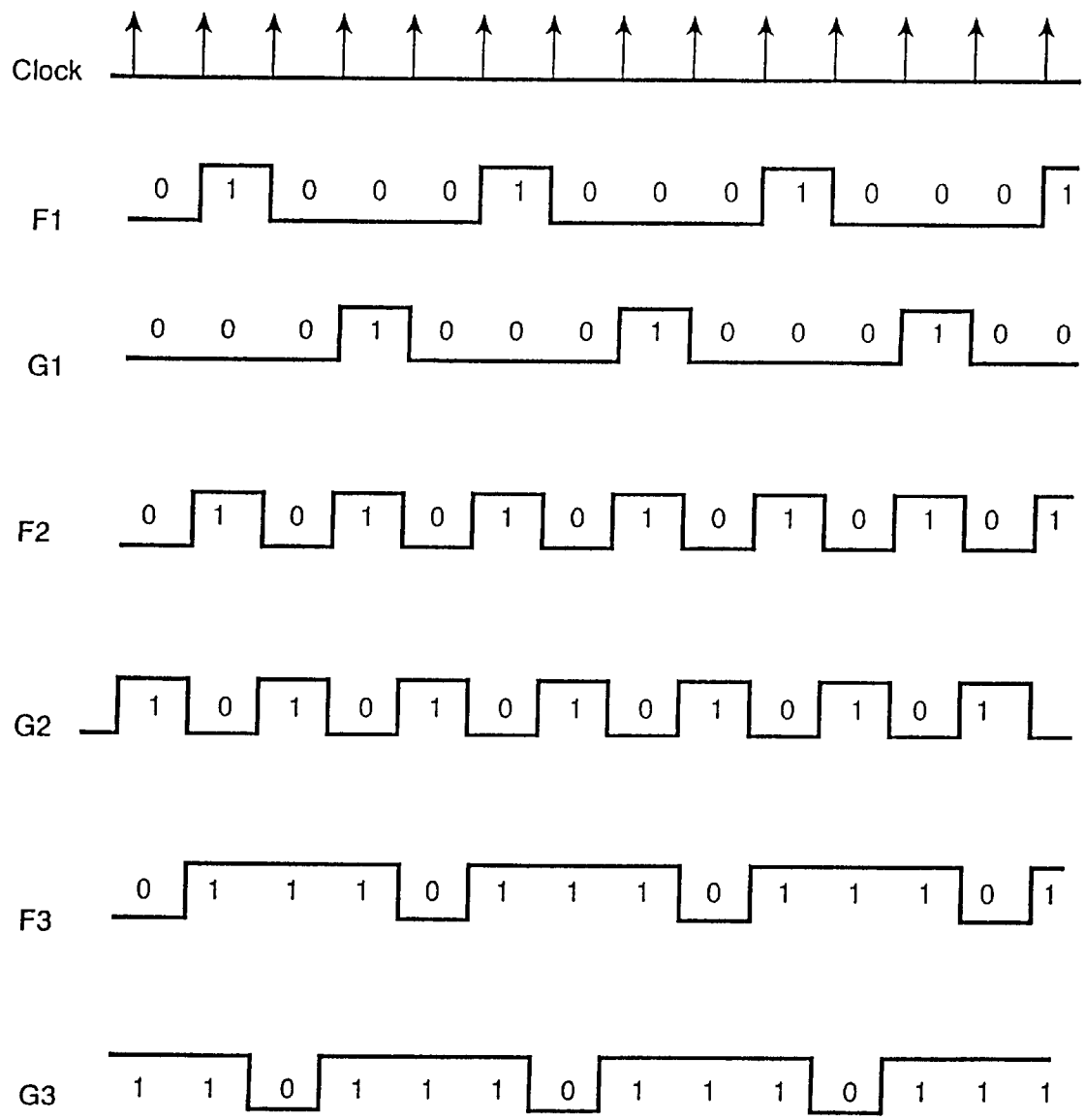
FIGS. 4 and 5 show an example of a dither pattern of the present invention.
Figure 5:
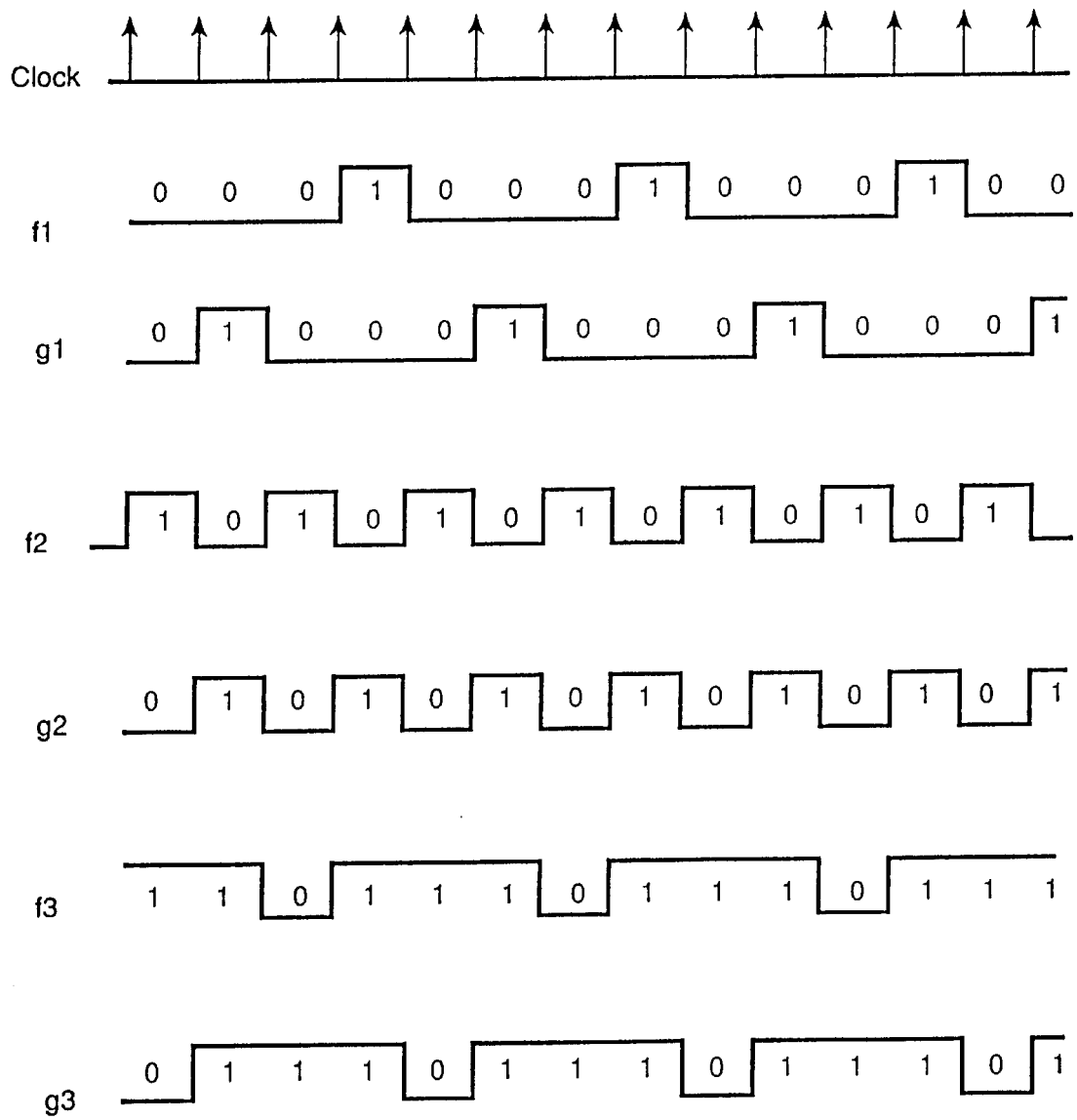

FIGS. 4 and 5 show an embodiment of the dither pattern applied to an interlaced 625 line video. As shown in FIG. 4, the line scanning of the interlaced 625 line video is performed by alternatively scanning two consecutive rosters. F1, F2 and F3 represent those consecutive scanning lines of a first roster. Similarly, G1, G2 and G3 represent those consecutive scanning lines of a second roster. These two succeeding rosters composite a first frame picture.

As for the first roster, as shown in FIG. 4, scanning line F1 is a clock signal derived from the dividing of the clock signal by 4. Scanning line F2 is a clock signal derived from the dividing of the clock signal by 2 and F3 is a clock signal derived from the dividing of the clock signal by 3/4. The frequency-dividing process is repeated in the following scanning lines of the first roster. Likewise, scanning line G1 of the second roster is a clock signal derived from the dividing of the clock signal by 4. Scanning line G2 of the second roster is a clock signal derived from the dividing of the clock signal by 2 and G3 is a clock signal derived from the dividing of the clock signal by 3/4. This frequency-dividing process is also repeated in the following scanning lines of the second roster.

Although every pair of consecutive scanning lines of the first frame, F1 and G1, have the same frequency with each other, the two consecutive scanning lines of the first frame have different phases. As a result, the dither pattern causes requested distortion compensation of the analog video signal.

Moreover, conventional interlaced 625 line video has an odd number of scanning lines per frame picture. Therefore, if the frequency-dividing ratio varies in the order of 1/4, 1/2 and 3/4, then the first scanning line of a second frame following the first frame has a frequency same as the first scanning line of the first frame. In other words, inverting of respective pairs of scanning lines of the first frame generates respective pairs of scanning lines of the second frame.

FIGS. 4 and 5 show the mentioned relationship between two consecutive frame that are dithered. Comparing the first frame of FIG. 4 with the second frame of FIG. 5, it may be found that the respective pairs of scanning lines of the second frame are an inverted version of the corresponding pairs of scanning lines of the first frame. For example, a pair of scanning lines F1 and G1 of the first frame corresponds to a pair of scanning lines g1 and f1 of the second frame, respectively, and the pair of scanning lines f1 and g1 of the second frame may be derived only with inverse of the pair of scanning lines F1 and G1 of the first frame. Likely, inverse of F2 and G2 may produce f2 and g2.

Figure 6:
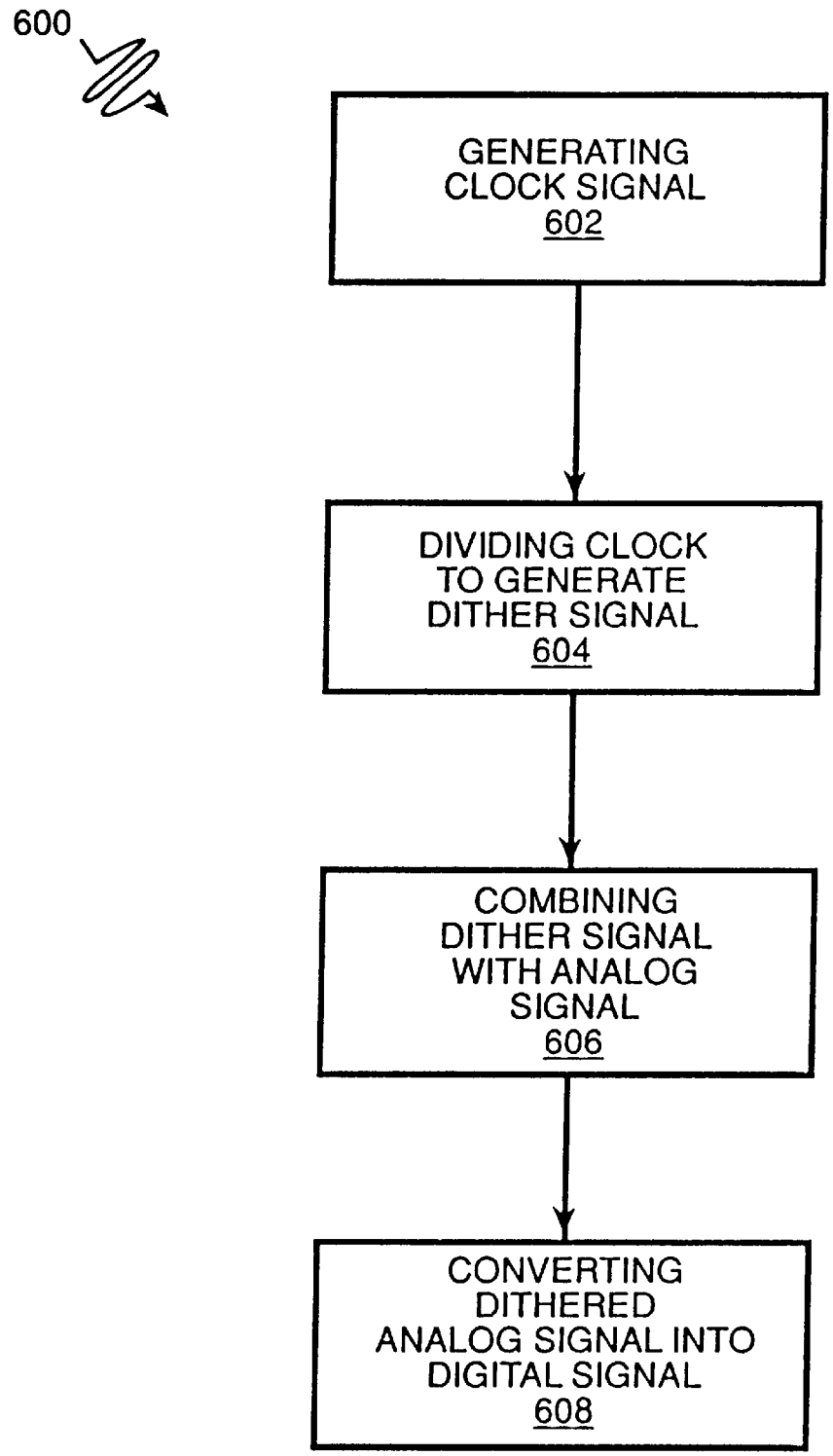
FIG. 6 is a flow chart of an analog signal processing method in accordance with the present invention.

A dither method 600 for an analog signal is shown in FIG. 6. A clock signal is first generated at procedure 602. The clock signal is then divided by a ratio conforming to P/N at procedure 604. As an example, the ratio conforms to $1/2^N$. In addition, the ratio is periodically varied so that the derived clock signal is a variable frequency signal. In each cycle of the variable frequency signal, there are a plurality of different frequencies. Also, respective cycles have different phases.

The variable frequency signal is combined with the analog signal at procedure 606, thereby generating a dithered analog signal. Moreover, the dithered analog signal is sampled in response to the clock signal and is converted into a digital signal, which is implemented at procedure 608. The method of the present invention may also be applied to process analog audio signals and analog video signals. Preferably, a digital TV video signal with reduced quantizing error is achieved using the method of the present invention.

One skilled in the art will recognize that the above described functions and components are somewhat more complex than represented by the present block diagrams, however from the disclosure and teachings herein, taken with the available applications literature available from the manufacturers of the suggested components, or from other components which may be substituted as will be known from the above disclosure, the construction of a practical and operatable device will be well within the capability of one skilled in the art without resorting to further invention or undue experimentation.

It will also be understood that the previous descriptions and explanations are given by way of example, and that numerous changes in the combinations of elements and functions as well as changes in design may be made without departing from the spirit and scope of the invention as hereinafter claimed. For example, an available periodic signal, other than a clock signal included in the dither device, may be used to generate the dither signal. The frequency-dividing ratio may also be adjusted so that the ratio is not periodically repeated. These and other modifications to and variations upon the embodiments described above are provided for by the present invention, the scope of which is limited only by the following claims.

What is claimed is:

1. An analog signal processing device comprising:
   means for providing an analog signal;

dither means for converting a frequency of a clock signal at a variable frequency-dividing ratio to generate a dither signal having a plurality of cycles, said ratio being repeated with a predetermined phase shift so that respective said cycles have different phases; and combining means for combining said dither signal with said analog signal so as to generate a composite analog signal; and whereby said analog signal processing device compensates a distortion of said analog signal by said dither signal.

2. An analog signal processing device as recited in claim 1 wherein said dither means comprises a signal generator for providing said clock signal.

3. An analog signal processing device as recited in claim 1 wherein said respective cycles have different frequencies.

4. An analog signal processing device as recited in claim 1 wherein said analog signal is an audio signal.

5. An analog signal processing device as recited in claim 1 wherein said analog signal is a video signal.

6. An analog signal processing device as recited in claim 1 further comprising an analog to digital convertor for converting said composite analog signal into a digital signal in response to said clock signal.

7. An analog signal processing device as recited in claim 6 wherein said analog to digital convertor has an output which ranges from 8 to 16 bits.

8. An analog signal processing device as recited in claim 1 wherein said ratio conforms to P/N, where P and N are positive integers and $1 \leq P \leq (N-1)$.

9. An analog signal processing device as recited in claim 8 wherein said ratio is periodically repeated in an order of 1/4, 1/2 and 3/4.

10. A processing device for an analog video signal having a synchronizing signal, said processing device comprising:

a sampling clock generator for providing a sampling clock signal in response to said synchronizing signal, said sampling clock signal having a predetermined frequency and a plurality of cycles;

dither means for converting said predetermined frequency at a variable ratio in response to said synchronizing signal so as to provide a compensating signal, said compensating signal having a plurality of frequency components in respective said cycles, each of said frequency components having a predetermined phase shift in respective said cycles; and combining means for combining said compensating signal with said analog video signal; and whereby said processing device provides a dither video signal which remarkably compensates distortion of said analog video signal.

11. A processing device as recited in claim 10 wherein said dither means comprises a phase control signal generator for generating a phase control signal in response to said synchronizing signal; and a frequency divider for converting the frequency of said sampling clock signal, said phase control signal generator controlling said frequency divider so that said each frequency component has said predetermined phase shift in said respective cycles.

12. A processing device as recited in claim 10 further comprising an analog to digital convertor for converting said dither video signal into a digital video signal in response to said sampling clock signal.

13. A processing device as recited in claim 12 wherein said analog to digital convertor has an output which ranges from 8 to 12 bits.

14. A processing device as recited in claim 13 wherein said ratio is periodically repeated in said respective cycles, said ratio conforms to P/N, where P and N are positive integers and $1 \leq P \leq (N-1)$.

15. A processing device as recited in claim 14 wherein said ratio conforms to $1/2^N$, where N is a positive integer.

16. A dither method for an analog signal comprising steps of:

converting periodically a frequency of a clock signal at a predetermined ratio so as to generate a dither signal, said dither signal having a variable frequency, said variable frequency having a predetermined phase shift in respective cycles of said dither signal; and combining said dither signal with said analog signal to produce a dithered analog signal; and converting said dither analog signal into a digital signal in response to said clock signal.

17. A dither method as recited in claim 16 wherein said analog signal is an audio signal.

18. A dither method as recited in claim 16 wherein said analog signal is a video signal.

19. A dither method as recited in claim 16 wherein said predetermined ratio varies periodically and conforms to P/N, where P and N are positive integers and $1 \leq P \leq (N-1)$.

* * * * *